United States Patent
Duvick et al.

[11] Patent Number: 5,929,630
[45] Date of Patent: Jul. 27, 1999

[54] MAGNETIC FLUX SENSOR APPARATUS

[75] Inventors: David L. Duvick, Eagan; Marcus J. Wieczorek, Lakeland; Terry R. Fahley, Lakeville, all of Minn.

[73] Assignee: Seagate Technology, Inc., Scotts Valley, Calif.

[21] Appl. No.: 08/938,080

[22] Filed: Sep. 26, 1997

[51] Int. Cl.⁶ .................................................. G01R 33/12
[52] U.S. Cl. .......................................... 324/205; 324/202
[58] Field of Search .................................. 324/200, 202, 324/205, 207.2, 207.21, 260, 262, 228, 259; 335/302; 73/1.79, 1.81; 360/109, 105

[56] References Cited

U.S. PATENT DOCUMENTS 5,500,589  3/1996  Sumcad ................................... 324/202
5,729,128  3/1998  Bunyer et al. .......................... 324/202

FOREIGN PATENT DOCUMENTS 1636763  3/1991  U.S.S.R. ................................. 324/205

*Primary Examiner*—Jay Patidar
*Attorney, Agent, or Firm*—Westman, Champlin & Kelly P.A.

[57] ABSTRACT

A flux sensitive device for creating electrical signals from magnetic flux produced by a magnetic piece has a first member defining a surface for sliding the magnetic piece. A conductive trace and a backiron are located proximate the first member such that the conductive trace is between the first member and the backiron. The position of the conductive loop is fixed relative to the backiron and the first member. The backiron forms a magnetic flux path with the magnetic piece and the conductive trace creates an electrical signal when magnetic flux crosses the conductive trace.

20 Claims, 5 Drawing Sheets

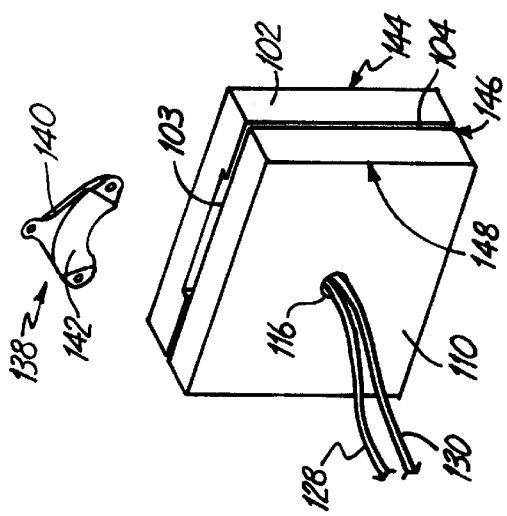
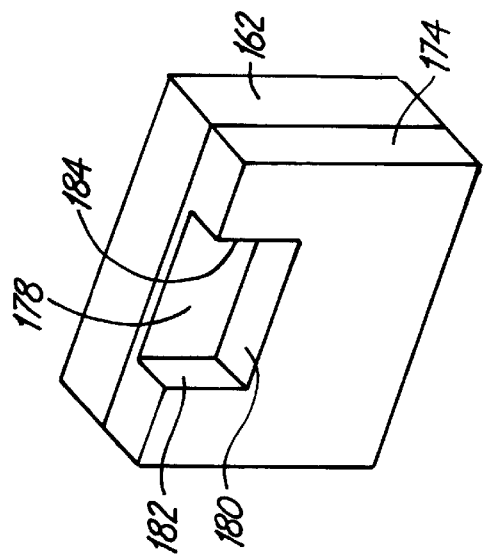
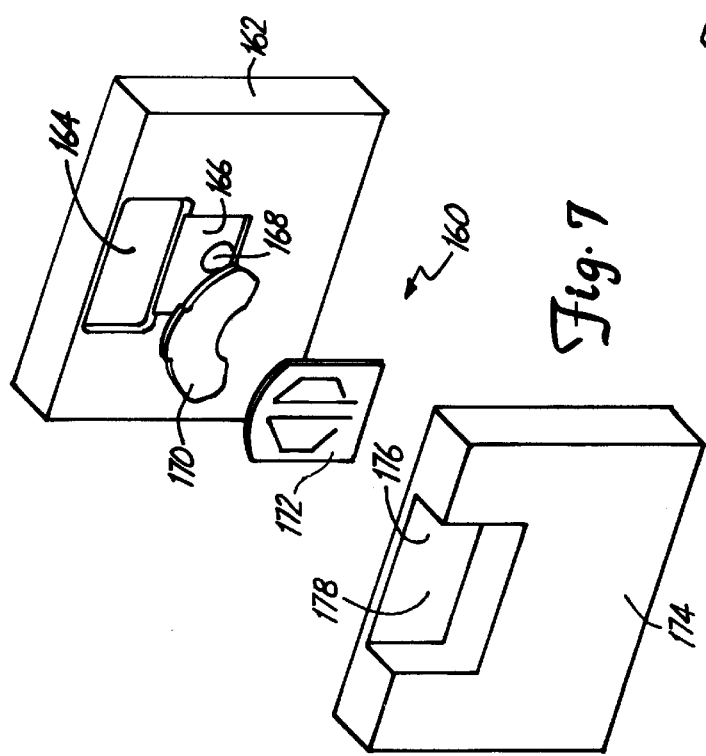
Fig. 6
Fig. 8
Fig. 7

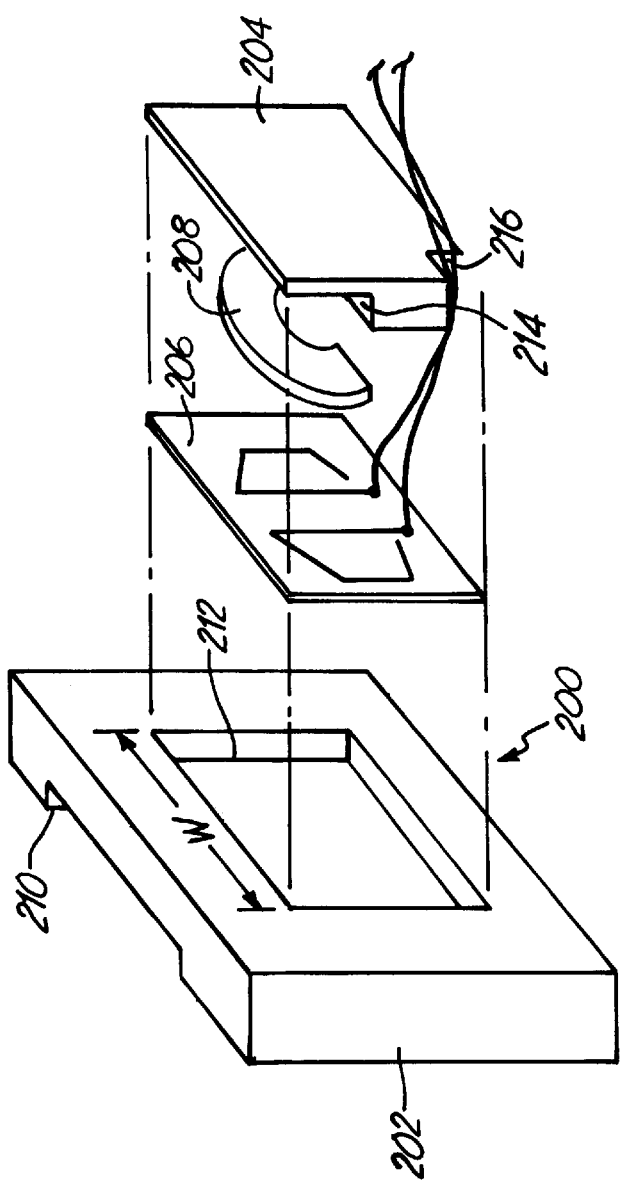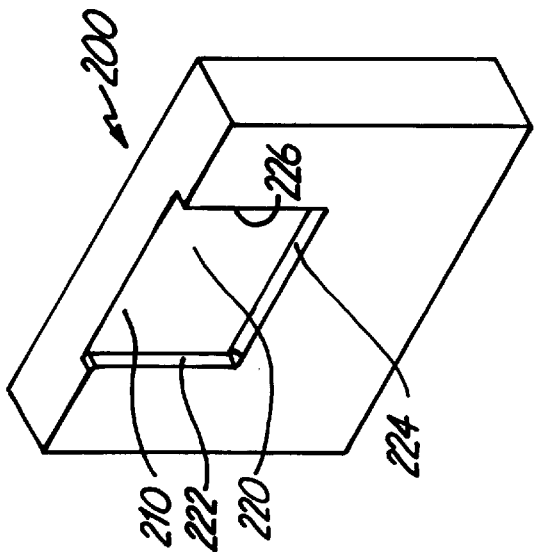

MAGNETIC FLUX SENSOR APPARATUS

FIELD OF THE INVENTION

The present invention relates to a flux tester. In particular, the present invention relates to a flux tester for use in a clean room environment.

BACKGROUND OF THE INVENTION

In magnetic disc storage devices, information is stored on a magnetic disc by changing the magnetic moments of a series of localized areas on the disc. Typically, the localized areas are organized as concentric tracks. To store or read information from the disc, a slider, which floats above the spinning disc, is positioned over the disc so that a head within the slider may read or write information to the disc. The slider is moved to different tracks across the disc by an actuator arm that is pivotally connected to the disc drive. The actuator arm is moved by an electromagnetic actuator formed by a current carrying conductive ring and two magnetic pole pieces. The conductive ring resides on the end of the actuator arm opposite the slider and is centered between the two pole pieces. A current passing through the conductive ring creates a magnetic field that interacts with the magnetic field created by the two pole pieces, causing the actuator arm to deflect, thereby moving the slider in an arc over the surface of the disc.

In order to achieve predictable and consistent actuator arm movement, the magnetic poles must be magnetized so that they produce a particular magnetic field. In particular, each magnetic pole in a particular line of disc drives must create the same magnetic field.

To ensure that the poles produce the proper magnetic field, a sampling of magnetic poles must be tested during the production of the disc drives. This testing involves placing each magnetic pole in a flux tester that measures the amount of magnetic flux generated by the pole. In general, such flux testers place a circuit loop adjacent the magnetic pole so that the circuit loop generally surrounds all of the magnetic flux produced by the magnetic pole. The circuit loop is then moved relative to the magnetic pole such that the circuit loop cuts through the flux lines created by the magnetic pole. Movement of the circuit loop through the flux lines creates a voltage in the circuit loop that is related to the magnetic flux density (weber/meter$^2$) produced by the pole piece and the speed at which the loop cuts through the flux lines. If this voltage is integrated relative to time, the amount of flux produced by the magnetic pole is obtained.

To provide consistent flux readings, the circuit loop must pass through each magnetic pole's flux lines in the same manner. To improve the consistency of the circuit loop's movement relative to the magnetic pole, prior art flux testers use a large number of elements that each need to be precisely manufactured. These elements are connected together by drilling holes in the elements and screwing the elements together. Although these testers eliminate some unwanted variations in the testing process, they still permit unacceptable amounts of variation in the movement of the circuit loop relative to the magnetic pole. In addition, each of the holes in the testers creates a location where dirt can accumulate.

The accumulation of dirt is undesirable since the testers are designed to be used in a clean room. In order for any apparatus to be placed in a clean room, the apparatus must be cleaned to remove any particles larger than 0.5 microns. In particular, everything that enters the clean room must be cleaned to remove magnetically charged particles that are larger than 0.5 microns. If these magnetically charged particles enter the clean room, it is possible for them to enter the disc drive being manufactured in the clean room. Such magnetic contamination can damage the disc by causing magnetic erasure of the data found on the disc.

In addition to being difficult to clean, the large number of elements found in the prior art are expensive to manufacture. As such the testers of the prior art are unacceptably expensive.

The present invention provides a solution to this and other problems, and offers other advantages over the prior art.

SUMMARY OF THE INVENTION

A flux sensitive device for creating electrical signals from magnetic flux produced by a magnetic piece has a first member defining a surface for sliding the magnetic piece. A conductive trace and a backiron are located proximate the first member such that the conductive trace is between the first member and the backiron. The position of the conductive loop is fixed relative to the backiron and the first member. The backiron forms a magnetic flux path with the magnetic piece and the conductive trace creates an electrical signal when magnetic flux crosses the conductive trace.

In preferred embodiments, a second member forms a housing chamber with the first member. In particular embodiments, the first and second members are constructed from single blocks of material that are bonded together with an adhesive to form the housing chamber.

In the several embodiments of the present invention, the backiron and the conductive trace are bonded within the housing chamber such that the backiron does not move relative to the conductive trace and neither the conductive trace nor the backiron move relative to the separating surface. The fixed position of the conductive trace and the backiron relative to the separating surface improves the repeatability of magnetic measurements by eliminating variations in the measurement that are due to movements of the backiron relative to the conductive trace.

In addition, since the device has no moving parts and is bonded together without screws, there are less crevices and holes in the present invention and, thus, less areas where contaminants can adhere to the testing device. Thus, the present invention is easier to clean and is better suited for clean room environments. In addition, since the present invention has fewer parts than prior art flux testers, it is less expensive to produce.

These and various other features as well as advantages which characterize the present invention will be apparent upon reading of the following detailed description and review of the associated drawings.

BRIEF DESCRIPTION OF THE DRAWINGS

FIG. 6 is a perspective view of flux tester 100 of FIG. 3 with its components bonded together.

FIG. 7 is an exploded diagram of a second embodiment of a flux tester of the present invention.

FIG. 8 is a perspective view of the flux tester of FIG. 7 with its elements bonded together.

FIG. 9 is an exploded view of a third embodiment of a flux tester of the present invention.

FIG. 10 is a perspective view of the flux tester of FIG. 9 from a reverse angle better showing recess 210.

DETAILED DESCRIPTION OF THE PREFERRED EMBODIMENTS

Figure 1:
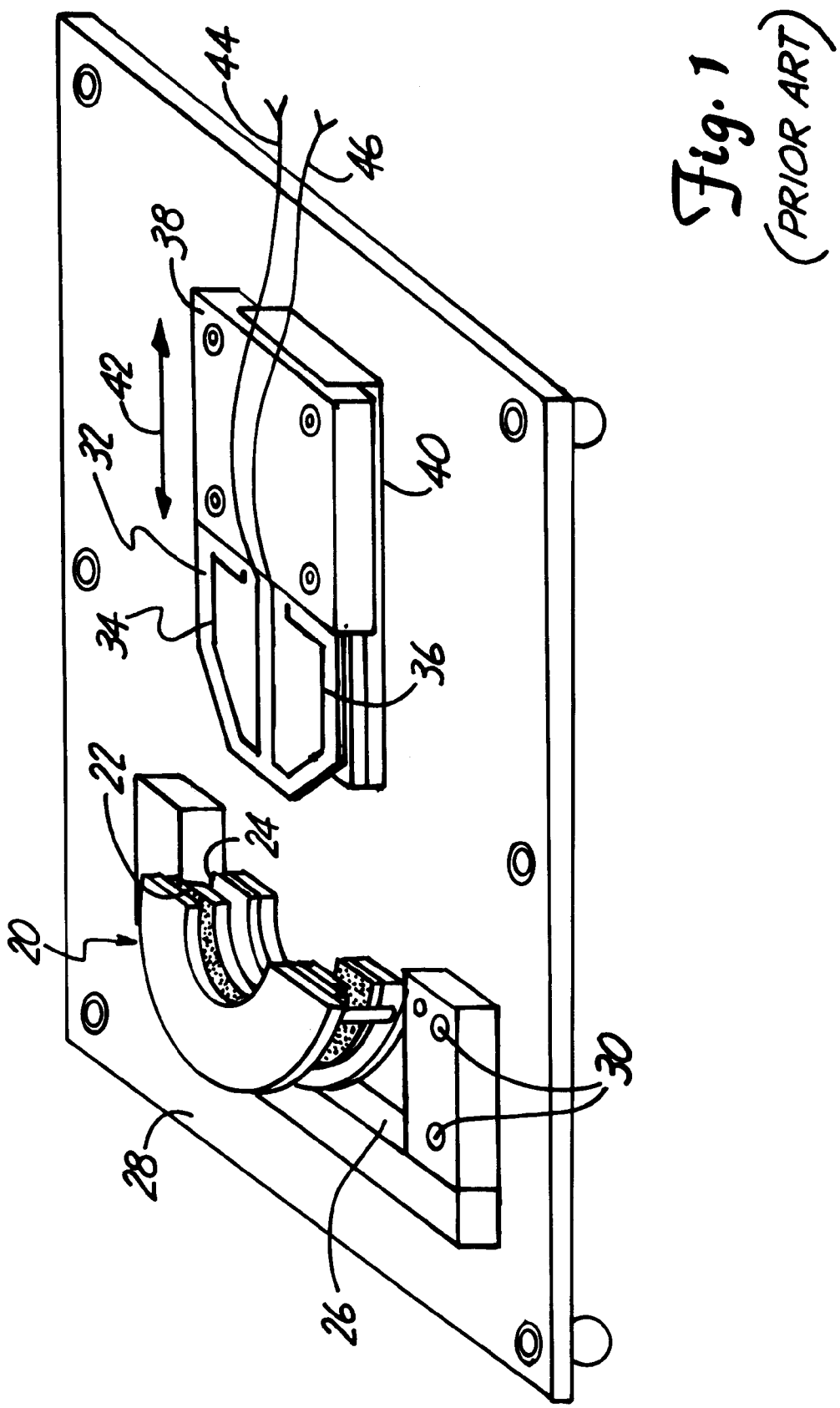
FIG. 1 is a first flux tester of the prior art.

FIG. 1 shows a flux tester of the prior art. A magnetic assembly 20 contains a top pole piece 22 and a bottom pole piece 24. Magnetic assembly 20 is supported in a fixed position in assembly holder 26, which is mounted to mounting board 28 through a plurality of screws 30.

A circuit board 32 having circuit traces 34 and 36 is mounted to a moveable carriage 38. Moveable carriage 38 frictionally glides along a support 40 in directions 42 parallel to support 40. Circuit traces 34 and 36 are coupled to a flux meter (not shown) by conductors 44 and 46, respectively. The flux meter sums the voltages created by each circuit trace and integrates the sum with respect to time to determine the flux produced by the magnetic pole. The flux meter then provides a display of the measured flux.

In operation, moveable carriage 38 is moved along the direction 42 so as to place circuit traces 34 and 36 between top pole piece 22 and bottom pole piece 24. The flux meter is reset so that it reads zero webers. Moveable carriage 38 is withdrawn on support 40 in direction 42 away from magnetic assembly 20. This causes circuit traces 34 and 36 to cut through magnetic flux lines extending between top pole piece 22 and bottom pole piece 24. The cutting of the flux lines generates voltages on each circuit trace and these voltages are summed and integrated by the flux meter.

The flux tester of FIG. 1 has several disadvantages. First, the tester requires many components in order to ensure repeatability of the testing process and these components make the tester difficult to clean. Specifically, it requires a magnetic assembly holder to ensure that assembly 20 is properly positioned. It also requires support 40 and moveable carriage 38 to ensure that circuit board 32 starts at the same position between the two pole pieces 22 and 24 and to ensure that circuit board 32 is removed in the same direction relative to the two pole pieces for each magnetic assembly that is tested. Changes in the starting position or in the direction circuit board 32 is pulled cause deviations in the measured flux that are not due to the actual flux between the two pole pieces 22 and 24.

Figure 2:
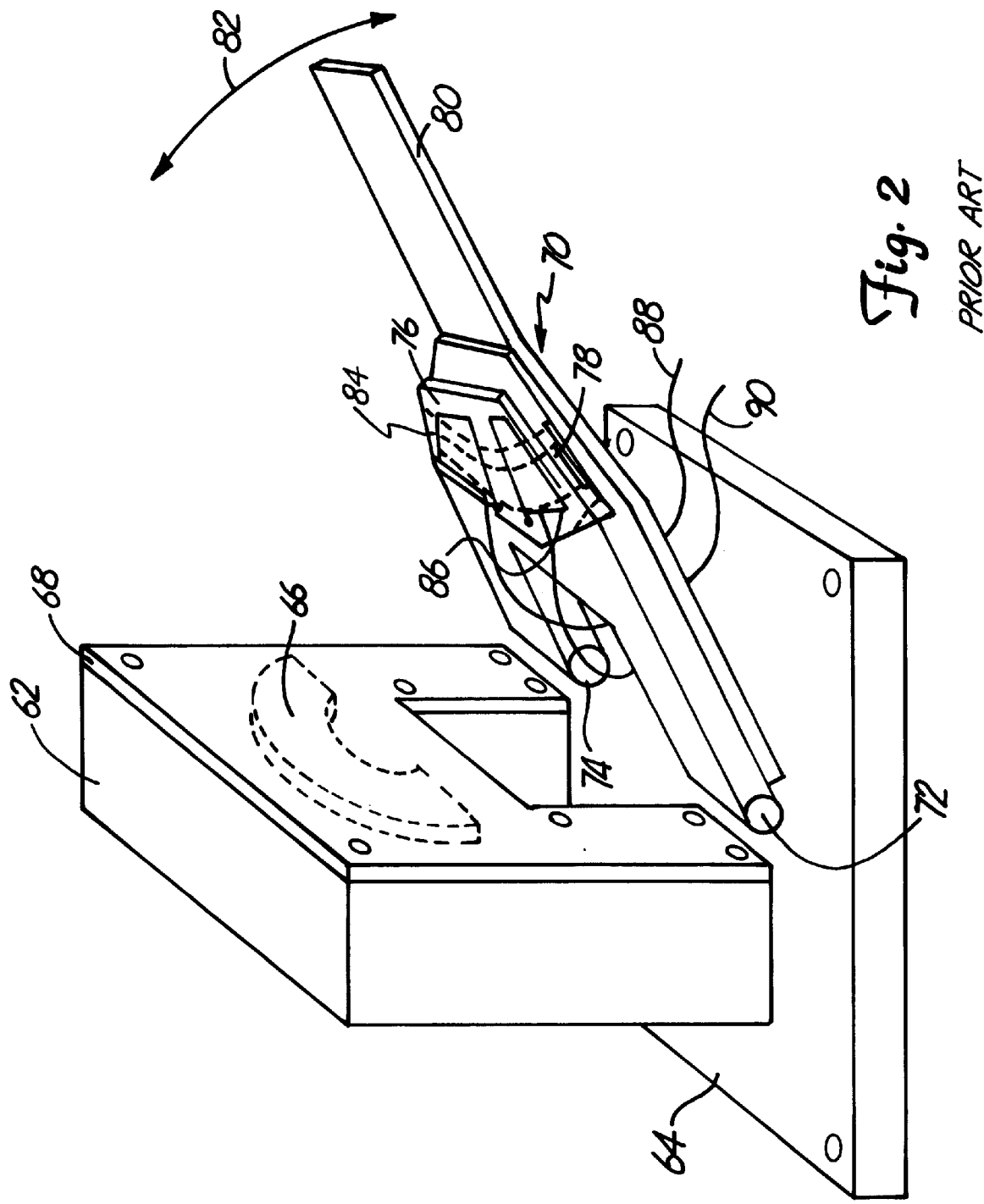
FIG. 2 is a second flux tester of the prior art.

FIG. 2 shows a second flux tester of the prior art. In FIG. 2 a block support 62, attached to a base 64, houses a backiron 66 shown in outline form. Backiron 66 is further constrained against support 62 by a cover plate 68 that is connected to block support 62.

A swing plate 70, attached to base 64 through hinges 72 and 74, supports circuit board 76 and pole piece 78. Swing plate 70 terminates in a handle 80, which is used to pivot swing plate 70 about hinges 72 and 74 in the directions generally indicated by arrows 82.

Circuit board 76 contains circuit traces 84 and 86, which are connected to a flux meter (not shown) by conductors 88 and 90, respectively. Conductors 88 and 90 pass through an opening in swing plate 70 so that they are not crushed when swing plate 70 is closed against cover plate 68.

In operation, swing plate 70 is pivoted so that circuit board 76 is in contact with cover plate 68. In this position, magnetic flux lines from pole piece 78, the pole piece being tested, extend through circuit board 76 and cover plate 68 to backiron 66. The magnetic flux lines passing between pole piece 78 and backiron 66 create an attractive force between the two pieces, which maintains swing plate 70 in an upright position.

At this point, the flux meter is reset so that it reads zero webers. Swing plate 70 is then pivoted away from cover plate 68, causing circuit traces 84 and 86 to intersect some of the flux lines between pole piece 78 and backiron 66. However, because the pole piece moves in an arc away from backiron 66, not all of the flux lines are crossed by circuit traces 84 and 86.

In addition, because pole piece 78 is not bound to circuit board 76 or swing plate 70, but instead merely resides between circuit board 76 and swing plate 70, pole piece 78 tends to move unpredictably as swing plate 70 is pivoted. The amount of movement of pole piece 78 generally varies with the speed at which swing plate 70 is pivoted. Faster pivoting of swing plate 70 generally causes more motion in the pole piece relative to circuit board 76. This additional movement is undesirable since it causes unpredictable amounts of flux lines to be cut by circuit traces 84 and 86. Thus, testing the same pole piece numerous times results in many different flux readings.

In addition, the tester of FIG. 2 suffers from many of the same problems as the tester of FIG. 1. Specifically, the tester of FIG. 2 involves numerous pieces that are mounted to a base. These numerous pieces are expensive to build and difficult to clean because of the screws required to mount the pieces together.

Figure 3:
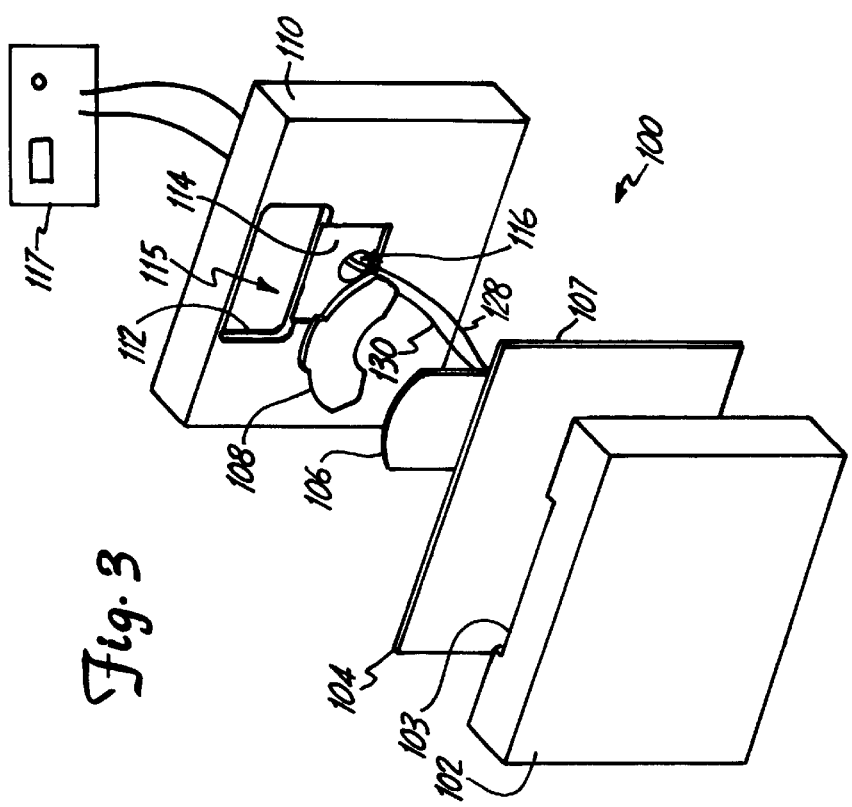
FIG. 3 is a first embodiment of the flux tester of the present invention shown in exploded form.

FIG. 3 is an exploded perspective view of flux tester 100, which is a first embodiment of the flux tester of the present invention. A first support structure 102, preferably formed of a single solid block of material, defines a recess 103. A separating sheet 104, preferably also made of a single sheet of material, bonds to first support structure 102 to form a partial chamber at recess 103. A second support structure 110, also preferably constructed from a single block of material, has two recesses defining the majority of a backiron sub-chamber 112 and a circuit board sub-chamber 114. In addition, a passageway 116 extends through the entirety of second support structure 110 and ends at circuit board sub-chamber 114. Together, backiron sub-chamber 112 and circuit board sub-chamber 114 along with a chamber surface 107 of separating member 104 form a housing chamber 115.

A backiron 108, shaped to fit the recess defining backiron sub-chamber 112, is bonded to second support structure 110 in the area defining backiron sub-chamber 112. This bonding places backiron 108 in bonding contact with second support structure 110. Backiron 108 is preferably constructed of a metallic material that is capable of being briefly magnetized in the presence of a magnetic field. When bonded, one surface of backiron 108 is preferably planar with a surface of second support structure 110 defining circuit board sub-chamber 114.

Circuit board 106 is bonded to backiron 108 and the surfaces of circuit board sub-chamber 114. Preferably, circuit board 106 is sized so that it fits tightly within circuit board sub-chamber 114. As discussed below, circuit board 106 contains conductive traces with connections to conductors 128 and 130 that pass through passageway 116 to flux meter 117.

In preferred embodiments, first support structure 102, separating sheet 104 and second support structure 110 are all constructed from the same material. Preferably, these three elements are constructed from acetal resin, which can be purchased from Dupont under the tradename Black Delrin®. Although acetal resin is preferred, other plastics may be used as long as they meet the requirements of the clean room where the flux tester will be used. Specifically, the plastic chosen should not outgas and should not wear quickly since plastics that wear quickly shed particles at an unacceptably high rate.

All of the elements of flux tester 100 are preferably bonded together using an adhesive such as Locktite 414® from Locktite Corporation. However, any means for bonding the elements together that does not require additional holes or crevices to be made is acceptable. Additional holes in the materials are to be avoided since such holes create additional locations for containments and thus add additional work to cleaning the apparatus. The fact that the present invention has few holes makes the invention cheaper to make and easier to clean than prior art testers.

As noted above, first support structures 102, separating sheet 104 and second support structure 110 are preferably each made of a single piece of material. For instance, the surfaces of first support structure 102 including those surfaces that define recess 103 are preferably formed by milling a single piece of material. Similarly, the surfaces of second support structure 110, including those that define backiron sub-chamber 112, circuit board sub-chamber 114 and passageway 116 are preferably formed by milling a single piece of material. Preferably, the milling produces extremely smooth surfaces so as to reduce possible contamination of the tester. In addition, passageway 116 may be filled with an epoxy that surrounds conductors 128 and 130. To prevent outgasing from the epoxy, the flux tester may be cured after the epoxy is placed in passageway 116.

Figure 4:
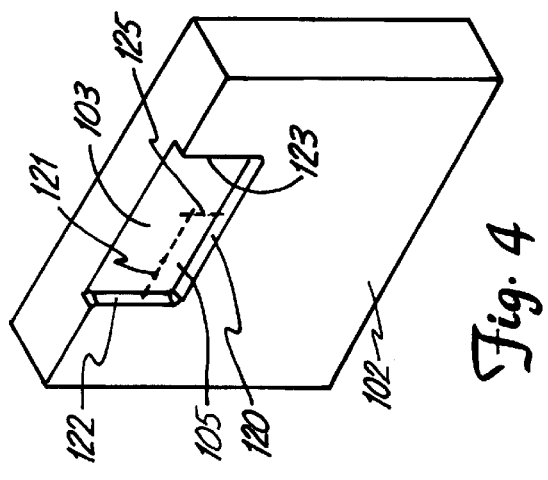
FIG. 4 is a perspective view showing first support structure 102 from a direction better showing recess 103.

FIG. 4 is a reverse angle perspective view of first support structure 102 of FIG. 3, more clearly showing recess 103. Recess 103 is defined by side surfaces 122 and 123, bottom surface 120 and separating surface 105. Side surface 122 and bottom surface 120 are located such that their normals, normals 121 and 125, respectively, intersect. A normal to a surface in this context is an imaginary line that extends from the surface and that is at right angles to the plane of the surface from which it originates. Because their normals intersect, side surface 122 and bottom surface 120 define a corner at the junction where they connect to each other. In preferred embodiments, the corner is rounded so as to facilitate easier cleaning. Note that together, side surface 122 and bottom surface 120 partially define separating surface 105.

Figure 5:
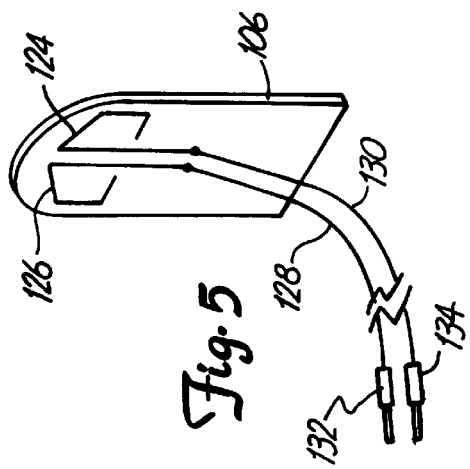
FIG. 5 is a perspective view of circuit board 106 of FIG. 3.

FIG. 5 is a reverse perspective view of circuit board 106 of FIG. 3. Circuit board 106 is preferably constructed from an insulator such as the plastic commonly used to support integrated circuits. Circuit board 106 contains conductive traces 124 and 126, each forming partial loops on circuit board 106 that are designed to surround two sets of flux lines from the magnet being tested. Conductive traces 124 and 126 are connected to conductors 128 and 130, respectively. Conductors 128 and 130 terminate in plugs 132 and 134 that may be inserted into flux meter 117 of FIG. 3. Flux meters, such as flux meter 117, are well known in the art and are capable of providing a flux value from the voltage induced across a circuit trace when the circuit trace cuts a magnetic flux line.

FIG. 6 shows a perspective view of flux tester 100 of FIG. 3 with its components bonded together. First support structure 102, separating sheet 104 and second support structure 110 are machined such that the surfaces that end at a seam are co-planar with a surface across the seam. Thus, surface 144 of first support structure 102 is co-planar with surfaces 146 and 148 of separating sheet 104 and second support structure 110, respectively. Having co-planar surfaces across the seams facilitates easier cleaning.

In operation, a magnet assembly 138, consisting of a base plate 140 and a magnetic pole piece 142, is inserted into the slot created by recess 103 and separating sheet 104. Preferably, magnetic assembly 138 is inserted into the slot such that the bottom of magnetic assembly 138 is in contact with bottom surface 120 which defines the bottom of recess 103. Once magnetic assembly 138 is fully inserted in the slot, the flux meter is reset to read zero flux. At this point, the magnetic assembly is withdrawn from the slot causing circuit traces 124 and 126 to cut the flux lines that extend between magnetic piece 142 and backiron 108. This causes a voltage to develop across circuit traces 124 and 126, and this voltage is used by flux meter 117 to determine the amount of flux cut by the traces.

Flux tester 100 of the present invention provides repeatable flux readings by controlling the starting position of magnetic assembly 138 and the movement of magnetic assembly 138 out of the slot. The starting position is controlled by bottom surfaces 120, which can be contoured to match the bottom of magnetic assembly 138. The movement is controlled by side surface 122, which prevents side-to-side movement of magnetic assembly 138, and by a magnetic attraction between backiron 108 and magnetic pole piece 142. This magnetic attraction causes magnetic pole piece 142 to remain flush against separating sheet 104 while magnetic assembly 138 is being withdrawn from the slot. The thickness of separating sheet 104 should be selected so that magnetic pole piece 142 is separated from backiron 108 sufficiently to allow magnetic assembly 138 to be withdrawn from the slot without undue force, while ensuring some magnetic attraction between magnetic pole piece 142 and backiron 108.

The present invention also restricts the movement of circuit board 106 so that only the movement of magnetic assembly 138 causes flux lines to be cut by circuit traces 124 and 126 of FIG. 5. This eliminates errors caused by unwanted movement of the circuit board relative to the magnetic assembly.

FIGS. 7 and 8 show a second embodiment of the present invention in which there is no separating sheet. FIG. 7 shows the second embodiment of the present invention in exploded form. As in FIG. 3, flux tester 160 of FIG. 7 includes a back support structure 162 that partially defines a backiron sub-chamber 164 and a circuit board sub-chamber 166. Back support structure 162 also has a passageway 168 that extends from circuit board sub-chamber 166 to an external surface of back support structure 162. Flux tester 160 also comprises a backiron 170 and a circuit board 172 similar to backiron 108 and circuit board 106 of FIG. 3. A front support structure 174 defines a front recess 176 that includes a separating surface 178.

FIG. 8 is a perspective view of flux tester 160 of FIG. 7 with the elements bonded together. Specifically, back support structure 162 is bonded to front support structure 174; backiron 170 is bonded to back support structure 162 and circuit board 172; and circuit board 172 is bonded to backiron 170 and a chamber surface of front support structure 174. Preferably each of these bonds is formed by an adhesive such as Locktite 414®.

As in flux tester 100 of FIG. 3, front support structure 174 and back support structure 162 are each preferably constructed from a single block of material. The shapes of back support structure 162 and front structure 174, including recess 176, backiron sub-chamber 164, circuit board sub-chamber 166, and passageway 178, are preferably produced by milling two solid blocks of material. The milling preferably provides smooth surfaces so that contaminants do not lodge on the surfaces. The preferred material is acetal resin, however, other clean room plastics may be used.

In operation, a magnetic assembly, such as magnetic assembly 138 of FIG. 6, is inserted into recess 176 such that the magnetic pole piece of the magnetic assembly is in contact with separating surface 178. Preferably, the magnetic assembly is inserted into recess 176 such that the bottom of the magnetic assembly is in contact with bottom surface 180 of recess 176. In addition, it is preferred that the width of recess 176 be such that the sides of the magnetic assembly are in contact with sidewalls 182 and 184 of recess 176. After the magnetic assembly is inserted in recess 176, a flux meter is reset. The flux meter is connected to traces on circuit board 172 via conductors that pass through passageway 168. Once the flux meter is reset, the magnetic assembly is withdrawn from recess 176 while maintaining contact between the magnetic assembly and separating surface 178. This contact is easy to maintain since there is a magnetic attraction between the magnetic pole piece of the magnetic assembly and backiron 170.

Side surfaces 182 and 184 are connected to bottom surface 180 and to separating surface 178 by rounded corners that facilitate easy cleaning. In addition, the normals to side surface 182, bottom surface 180, and separating surface 178 intersect each other.

FIG. 9 shows a third embodiment of the present invention in exploded form wherein a flux tester 200 has a front support structure 202 and a back support structure 204 that together form a chamber in which a circuit board 206 and a backiron 208 are housed. Front support structure 202 further defines a recess 210 where a magnetic assembly may be slid. A recess 212 formed in the rear of front support structure 202 defines a portion of the chamber where circuit board 206 and backiron 208 reside. Recess 212 preferably has a width, denoted as W in FIG. 9, that is equal to the widths of backiron 208 and circuit board 206 such that the sides of recess 212 are in contact with the sides of backiron 208 and circuit board 206.

Back support structure 204 is preferably milled such that it tightly fits within recess 212. When fully inserted, the back surface of back support structure 204 is coplanar with the back surface of front support structure 202. In addition, back support structure 204 is preferably milled to create a shelf 214 on which backiron 208 is supported, and a recess 216 that provides a passageway from the chamber to an external surface. Conductors connected to traces on circuit board 206 pass through recess 216 and are connected to a flux meter (not shown).

It is preferred that front support structure 202 and back support structure 204 be constructed from single pieces of material and preferably from acetal resin. In addition, it is preferred that all of the components of flux tester 200 be bonded together with an adhesive such as Locktite 414®.

FIG. 10 shows a reverse angle perspective view of flux tester 200 of FIG. 9, that better shows recess 210. Recess 210 is defined by a separating surface 220, side surfaces 222 and 226, and a bottom surface 224. The perimeter of separating surface 220 is at least partially defined by side surface 222 and bottom surface 224. Separating surface 220, bottom surface 224 and side surfaces 222 and 226 are each connected together at rounded corners such that the normals to each of the surfaces intersect each other. In this context, a normal to a surface is an imaginary line arising out of the surface so that the normal is perpendicular to the plane of the surface.

In operation, a magnetic assembly such as magnetic assembly 138 of FIG. 6, is inserted into recess 210 such that the magnetic pole piece is in contact with separating surface 220. Preferably, the magnetic assembly is inserted such that the bottom of the magnetic assembly is in contact with bottom surface 224 and the sides of the magnetic assembly are in contact with side surfaces 222 and 226.

Once the magnetic assembly is fully inserted in recess 210, the flux meter is reset and the magnetic assembly is withdrawn from recess 210 while maintaining contact between the magnetic pole piece and separating surface 220. Because of a magnetic attraction between the magnetic pole piece and backiron 208, it is not difficult to maintain contact between the magnetic pole piece and separating surface 220. In addition, while withdrawing the magnetic assembly, side surfaces 222 and 226 prevent the magnetic assembly from rotating and thereby ensure that the process is repeatable.

In summary and with reference to FIGS. 3 and 4, a flux testing device is disclosed for measuring magnetic flux produced by a magnetic piece. The flux testing device has a first support structure 102 defining a recess 103 with a side edge 122 and bottom edge 120. A separating member 104 has a separating surface 105 partially defined by side edge 122 and bottom edge 120. In addition, separating member 104 has a chamber surface 107 that together with a second support structure 110 at least partially defines a housing chamber 115. A conductive trace 124 is located in the housing chamber 115 between chamber surface 107 and a backiron 108. A conductor 128 is connected to the circuit trace 124 and passes through a passageway 116 from the housing chamber 115 to an external surface of the flux testing device.

The housing chamber 115 consists of a backiron sub-chamber 112 and a conductive trace sub-chamber 114 that house backiron 108 and conductive trace 106, respectively. Backiron 108 is bonded to backiron sub-chamber 112 such that the surface of backiron 108 is coplanar with a surface of second support structure 110.

Preferably the first support structure 102 and the second support structure 110 are constructed from single blocks of material. In addition, the entire testing device is bonded together using an adhesive appropriate for clean room environments.

In addition, although the present invention has been described with reference to preferred embodiments, workers skilled in the art will recognize that changes may be made in form and detail without departing from the spirit and scope of the invention. Further, while the invention has been described from use with magnetic assemblies associated with magnetic disc drives, it is clear that the invention may be used to test the flux of any magnetic piece.

It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the flux tester while maintaining substantially the same functionality without departing from the scope and spirit of the present invention. In addition, although the preferred embodiment described herein is directed to a flux tester for testing components in a disc drive system, it will be appreciated by those skilled in the art that the teachings of the present invention can be applied to other systems that use magnetic components, like motors, without departing from the scope and spirit of the present invention. In addition, although three shapes have been shown for the present invention, those skilled in the art will recognize that other shapes are possible including round or hexagonal support structures.

What is claimed is:

1. A flux sensitive device for creating an electrical signal from magnetic flux produced by a magnetic piece, the flux sensitive device comprising:
    a separating member having a separating surface and a chamber surface, the chamber surface at least partially defining a housing chamber;
    a backiron, located in the housing chamber, for forming a magnetic flux path between the backiron and the magnetic piece when the magnetic piece is located at at least one position on the separating surface; and
    a conductive trace, located in the housing chamber between the backiron and the chamber surface, the conductive trace creating an electrical signal when magnetic flux crosses through the conductive trace.

2. The device of claim 1 wherein the separating member is bonded to a back support structure to form the housing chamber.

3. The flux sensing device of claim 2 wherein the separating member is bonded to the back support structure with an adhesive.

4. The device of claim 1 wherein the housing chamber comprises a backiron sub-chamber and a conductive trace sub-chamber.

5. The device of claim 4 wherein the backiron is positioned in the backiron sub-chamber such that the backiron is in bonding contact with surfaces that define a portion of the backiron sub-chamber.

6. The device of claim 4 wherein the backiron is positioned in the backiron sub-chamber such that the surface of the backiron is coplanar with a surface defining a portion of the conductive trace sub-chamber.

7. The device of claim 2 wherein the separating member is formed in a front support structure that is constructed from a single block of material.

8. The device of claim 7 wherein the back support structure is constructed from a single block of material.

9. The device of claim 8 wherein a first exterior surface of the separating member is connected to a second exterior surface of the separating member through a rounded corner.

10. The flux device of claim 1 further comprising a flux meter connected to a conductive trace through a conductor, the flux meter for creating a flux reading from the electrical signal produced by the conductive trace.

11. A flux measuring apparatus for measuring flux created by a magnetic member, the apparatus comprising:
    a first member providing a sliding surface for the magnetic member;
    a metal piece, capable of creating a magnetic flux path with the magnetic member; and
    a conductive loop, located between the metal piece and the first member, the position of the conductive loop fixed relative to the metal piece and the first member, the conductive loop producing an electrical signal when magnetic flux crosses a portion of the conductive loop.

12. The flux measuring apparatus of claim 11 further comprising a flux meter connected to the conductive loop through a conductor for creating a flux reading from the electrical signal produced by the conductive loop.

13. The flux measuring apparatus of claim 11 wherein the conductive loop is bonded to the first member.

14. The flux measuring apparatus of claim 13 wherein the conductive loop is imprinted on a circuit board.

15. The flux measuring apparatus of claim 14 wherein the metal piece is bonded to the circuit board.

16. The flux measuring apparatus of claim 11 further comprising a second member bonded to the first member, the first member and second member forming a chamber.

17. The flux measuring apparatus of claim 16 wherein the conductive loop and metal piece are positioned within the chamber.

18. The flux measuring apparatus of claim 17 wherein the first member and second member are formed from a first single block of material and a second single block of material, respectively.

19. The flux measuring apparatus of claim 18 wherein the first member comprises at least one rounded corner.

20. The flux measuring apparatus of claim 18 wherein the first member is bonded to the second member with an adhesive.

* * * * *